United States Patent
Doyle et al.

(10) Patent No.: US 10,964,886 B2
(45) Date of Patent: Mar. 30, 2021

(54) SPIN TRANSFER TORQUE MEMORY DEVICES HAVING HEUSLER MAGNETIC TUNNEL JUNCTIONS

(71) Applicant: Intel Corporation, Santa Clara, CA (US)

(72) Inventors: Brian Doyle, Portland, OR (US); Kaan Oguz, Beaverton, OR (US); Satyarth Suri, Portland, OR (US); Kevin O'Brien, Portland, OR (US); Mark Doczy, Beaverton, OR (US); Charles Kuo, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/329,169

(22) PCT Filed: Sep. 27, 2016

(86) PCT No.: PCT/US2016/053968
§ 371 (c)(1),
(2) Date: Feb. 27, 2019

(87) PCT Pub. No.: WO2018/063159
PCT Pub. Date: Apr. 5, 2018

(65) Prior Publication Data
US 2019/0189913 A1    Jun. 20, 2019

(51) Int. Cl.
*H01L 29/82* (2006.01)
*H01L 43/10* (2006.01)
(Continued)

(52) U.S. Cl.
CPC .............. *H01L 43/10* (2013.01); *G11C 11/16* (2013.01); *G11C 11/161* (2013.01);
(Continued)

(58) Field of Classification Search
CPC ......... H01L 43/10; H01L 43/02; H01L 43/08; H01L 43/12; H01L 27/228; G11C 11/16;
(Continued)

(56) References Cited

U.S. PATENT DOCUMENTS

2007/0228501 A1* 10/2007 Nakamura ............. B82Y 25/00
257/421
2008/0151608 A1*  6/2008 Hosotani ................. G11C 11/16
365/158
(Continued)

OTHER PUBLICATIONS

International Preliminary Report on Patentability dated Apr. 11, 2019 for PCT Patent Application No. PCT/US16/53968.
(Continued)

*Primary Examiner* — Calvin Y Choi
(74) *Attorney, Agent, or Firm* — Green, Howard & Mughal LLP

(57) ABSTRACT

The present disclosure relates to the fabrication of spin transfer torque memory devices, wherein a magnetic tunnel junction of the spin transfer torque memory device is formed with Heusler alloys as the fixed and free magnetic layers and a tunnel barrier layer disposed between and abutting the fixed Heusler magnetic layer and the free Heusler magnetic layer, wherein the tunnel barrier layer is lattice matched to the free Heusler magnetic layer. In one embodiment, the tunnel barrier layer may be a strontium titanate layer.

25 Claims, 6 Drawing Sheets

(51) Int. Cl.
   *H01L 27/22* (2006.01)
   *H01L 43/08* (2006.01)
   *G11C 11/16* (2006.01)
   *H01F 10/32* (2006.01)
   *H01L 43/02* (2006.01)
   *H01L 43/12* (2006.01)

(52) U.S. Cl.
   CPC .......... *H01F 10/329* (2013.01); *H01L 27/228* (2013.01); *H01L 43/02* (2013.01); *H01L 43/08* (2013.01); *H01L 43/12* (2013.01)

(58) Field of Classification Search
   CPC ........... G11C 11/161; G11C 2211/5615; H01F 10/329
   USPC ......................................................... 257/421
   See application file for complete search history.

(56) References Cited

U.S. PATENT DOCUMENTS

| | | |
|---|---|---|
| 2010/0074092 A1 | 3/2010 | Zhu et al. |
| 2012/0063218 A1 | 3/2012 | Huai et al. |
| 2012/0112299 A1* | 5/2012 | Inomata ............... G01R 33/098 257/421 |
| 2013/0051135 A1 | 2/2013 | Clinton et al. |
| 2015/0162378 A1* | 6/2015 | Carey .................... H01L 43/02 257/421 |
| 2015/0255711 A1 | 9/2015 | Doyle et al. |
| 2016/0276007 A1* | 9/2016 | Sugiyama ............. G11C 11/161 |

OTHER PUBLICATIONS

International Search Report and Written Opinion from PCT/US2016/053968 dated May 24, 2017, 12 pgs.

Reiss, G. et al., "Heusler Compounds (and Related) in Magnetic Tunnel Junctions", Jul. 30, 2015. <URL: http://cspin.umn.edu/events/heuslers2015/presentations/g_reiss.pdf> 31 pgs.

* cited by examiner

SPIN TRANSFER TORQUE MEMORY DEVICES HAVING HEUSLER MAGNETIC TUNNEL JUNCTIONS

CLAIM OF PRIORITY

This Application is a National Stage Entry of, and claims priority to, PCT Application No. PCT/US2016/053968, filed on Sep. 27, 2016 and titled "SPIN TRANSFER TORQUE MEMORY DEVICES HAVING HEUSLER MAGNETIC TUNNEL JUNCTIONS", which is incorporated by reference in its entirety for all purposes.

BACKGROUND OF THE INVENTION

Embodiments of the present description generally relate to the field of microelectronic devices, and, more particularly, to spin transfer torque memory devices.

BACKGROUND

Higher performance, lower cost, increased miniaturization of integrated circuit components, and greater packaging density of integrated circuits are ongoing goals of the microelectronic industry for the fabrication of microelectronic logic and memory devices. Spin devices, such as spin logic and spin memory, can enable a new class of logic and architectures for microelectronic components. Thus, there is an ongoing drive to improve the design and efficiency of these spin devices.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1A:
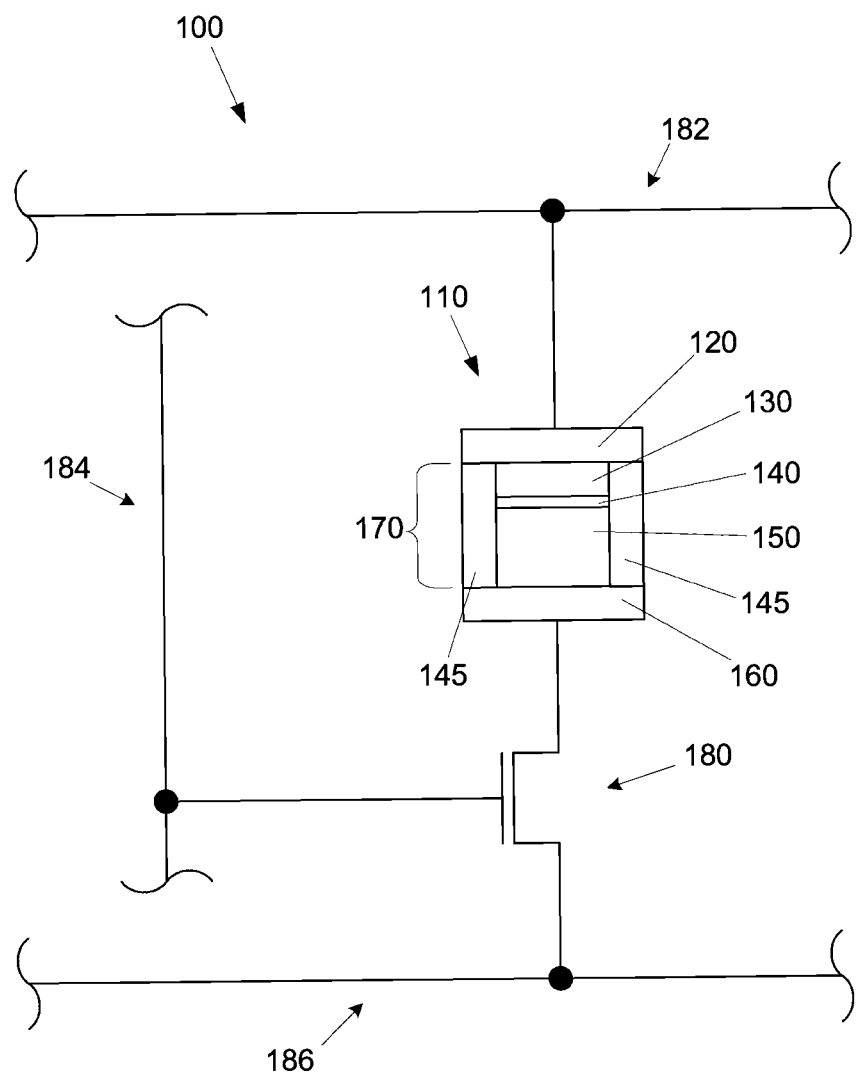
FIG. 1a is a schematic diagram illustrating a spin transfer torque memory device in accordance with an embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Embodiments of the present description relate to the fabrication of spin transfer torque memory devices, wherein a magnetic tunnel junction of the spin transfer torque memory device is formed with Heusler alloys as the fixed and free magnetic layers and a tunnel barrier layer disposed between and abutting the fixed Heusler magnetic layer and the free Heusler magnetic layer, wherein the tunnel barrier layer is lattice matched to the free Heusler magnetic. In one embodiment, the tunnel barrier layer may be a strontium titanate layer.

FIG. 1a shows a schematic of a microelectronic device, illustrated as a spin transfer torque memory cell 100 which includes a spin transfer torque element 110. The spin transfer torque element 110 may comprise a top cap/contact or free magnetic layer electrode 120 with a free magnetic layer 130 adjacent the free magnetic layer electrode 120, a bottom cap or fixed magnetic layer electrode 160 adjacent a pinned or fixed magnetic layer 150, and a tunnel barrier layer 140 disposed between the free magnetic layer 130 and the fixed magnetic layer 150. A dielectric material 145 may be formed adjacent the fixed magnetic layer electrode 160, the fixed magnetic layer 150, and the tunnel barrier layer 140. The free magnetic layer electrode 120 may be electrically connected to a bit line 182. The fixed magnetic layer electrode 160 may be connected to a transistor 180. The transistor 180 may be connected to a word line 184 and a signal line 186 in a manner that will be understood to those skilled in the art. The spin transfer torque memory cell 100 may further include additional read and write circuitry (not shown), a sense amplifier (not shown), a bit line reference (not shown), and the like, as will be understood by those skilled in the art, for the operation of the spin transfer torque memory cell 100. It is understood that a plurality of the spin transfer torque memory cells 100 may be operably connected to one another to form a memory array (not shown), wherein the memory array can be incorporated into a non-volatile memory device.

The portion of the spin transfer torque element 110 comprising the free magnetic layer 130, the tunnel barrier layer 140, and the fixed magnetic layer 150 is known as a magnetic tunnel junction 170.

Figure 1B:
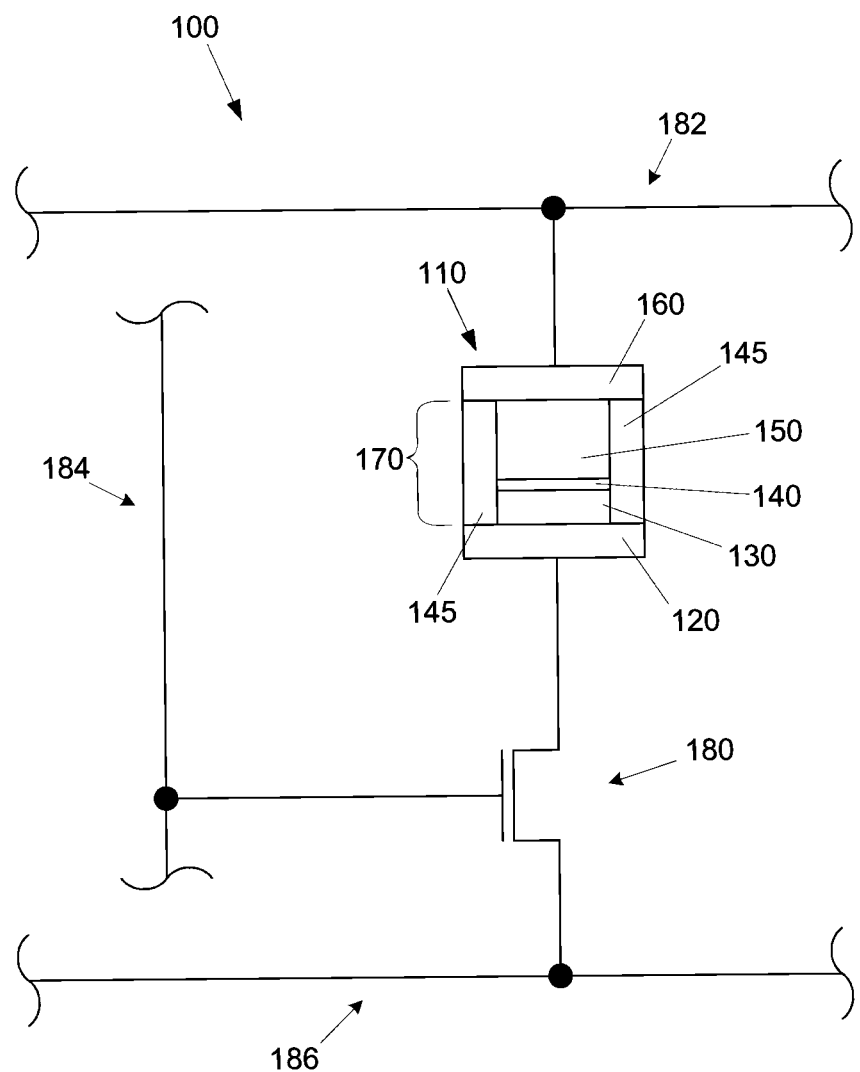
FIG. 1b is a schematic diagram illustrating a spin transfer torque memory device in accordance with another embodiment of the present description.

As shown in FIG. 1b, the spin transfer torque memory device 100 may have a reverse orientation, wherein the free magnetic layer electrode 120 may be electrically connected to the transistor 180 and the fixed magnetic layer electrode 160 may be connected to the bit line 182.

Figure 2A:
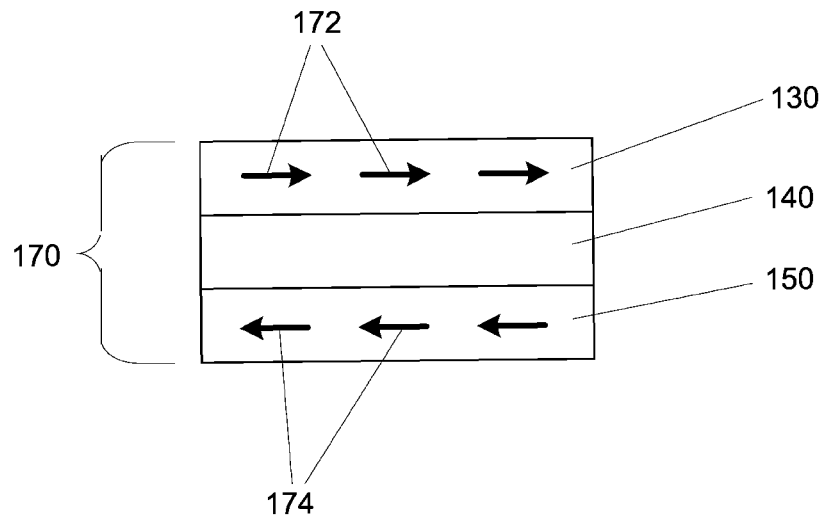
FIG. 2a is a side view schematic illustrating a magnetic tunnel junction with a free magnetic layer having a magnetic orientation anti-parallel to a fixed magnetic layer in accordance with an embodiment of the present description.
Figure 2B:
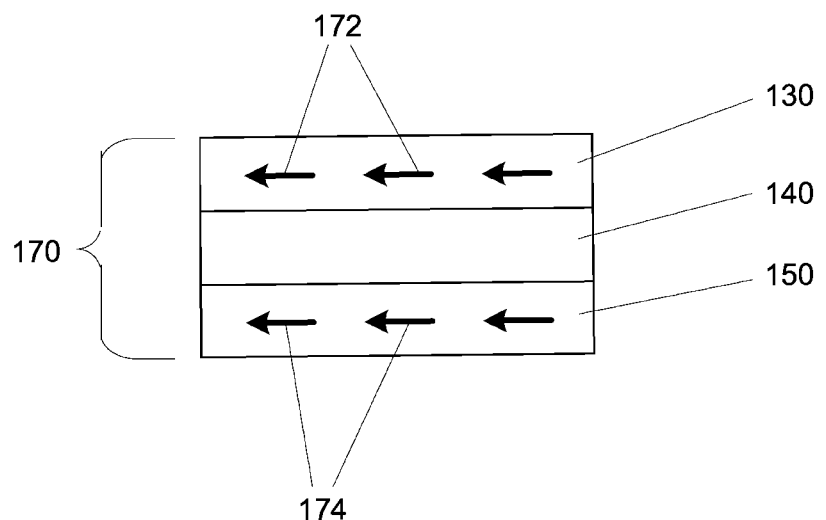
FIG. 2b is a side view schematic illustrating a magnetic tunnel junction with a free magnetic layer having a magnetic orientation parallel to a fixed magnetic layer in accordance with an embodiment of the present description.

Referring to FIGS. 2a and 2b, the magnetic tunnel junction 170 functions essentially as a resistor, where the resistance of an electrical path through the magnetic tunnel junction 170 may exist in two resistive states, either "high" or "low", depending on the direction or orientation of magnetization (illustrated as in-plane for simplicity, as the orientation may also be in the vertical direction) in the free magnetic layer 130 and in the fixed magnetic layer 150. FIG. 2a illustrates a high resistive state, wherein direction of magnetization in the free magnetic layer 130 and the fixed magnetic layer 150 are substantially opposed or anti-parallel with one another. This is illustrated with arrows 172 in the free magnetic layer 130 pointing from left to right and with arrows 174 in the fixed magnetic layer 150 aligned in opposition pointing from right to left. FIG. 2b illustrates a low resistive state, wherein direction of magnetization in the free magnetic layer 130 and the fixed magnetic layer 150 are substantially aligned or parallel with one another. This is illustrated with arrows 172 in the free magnetic layer 130 and with arrows 174 in the fixed magnetic layer 150 aligned the same direction pointing from right to left.

It is understood that the terms "low" and "high" with regard to the resistive state of the magnetic tunnel junction 170 are relative to one another. In other words, the high resistive state is merely a detectibly higher resistance than the low resistive state, and vice versa. Thus, with a detectible difference in resistance, the low and high resistive states can represent different bits of information (i.e. a "0" or a "1").

The direction of magnetization in the free magnetic layer 130 may be switched through a process call spin transfer torque ("STT") using a spin-polarized current. An electrical current is generally unpolarized (e.g. consisting of about 50% spin-up and about 50% spin-down electrons). A spin polarized current is one with a great number of electrons of either spin-up or spin-down, which may be generated by passing a current through the fixed magnetic layer 150. The electrons of the spin polarized current from the fixed magnetic layer 150 tunnel through the tunnel barrier layer 140 and transfers its spin angular momentum to the free magnetic layer 130, wherein to free magnetic layer 130 will orient its magnetic direction from anti-parallel, as shown in FIG. 2a, to that of the fixed magnetic layer 150 or parallel, as shown in FIG. 2b. The free magnetic layer 130 may be returned to its origin orientation, shown in FIG. 2a, by reversing the current.

Figure 3:
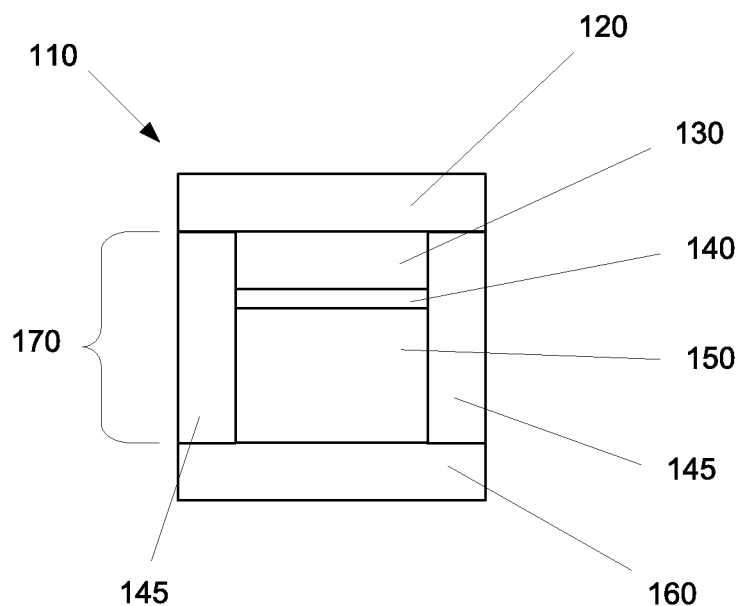
FIG. 3 is a side view schematic of a magnetic tunnel junction.

Thus, the magnetic tunnel junction 170 may store a single bit of information ("0" or "1") by its state of magnetization. The information stored in the magnetic tunnel junction 170 is sensed by driving a current through the magnetic tunnel junction 170. The free magnetic layer 130 does not require power to retain its magnetic orientations; thus, the state of the magnetic tunnel junction 170 is preserved when power to the device is removed. Therefore, the spin transfer torque memory device 100 of FIGS. 1a and 1b is non-volatile. In one embodiment of the magnetic tunnel junction 170, as shown in FIG. 3, the free magnetic layer 130 and the fixed magnetic layer 150 may comprise a ferromagnetic layer, such as a cobalt/iron/boron (CoFeB) alloy, and the tunnel barrier layer 140 may comprise an insulative oxide layer, such as magnesium oxide (MgO). Thus, when the CoFeB free magnetic layer 130 and the CoFeB fixed magnetic layer 150 are magnetically polarized in the same direction, the spins conduct through the insulative MgO tunnel barrier layer 140. It is understood that other layer could be incorporated into the magnetic tunnel junction 170, such as an antiferromagnetic layer between the CoFeB fixed magnetic layer 150 and the fixed magnetic layer electrode 160. When the CoFeB free magnetic layer 130 and the CoFeB fixed magnetic layer 150 are magnetically polarized in opposite directions, the insulative MgO tunnel barrier layer 140 acts so as to block the spin-down minority carriers, and the resistance of the magnetic tunnel junction 170 increases, as will be understood to those skilled in the art.

Figure 4:
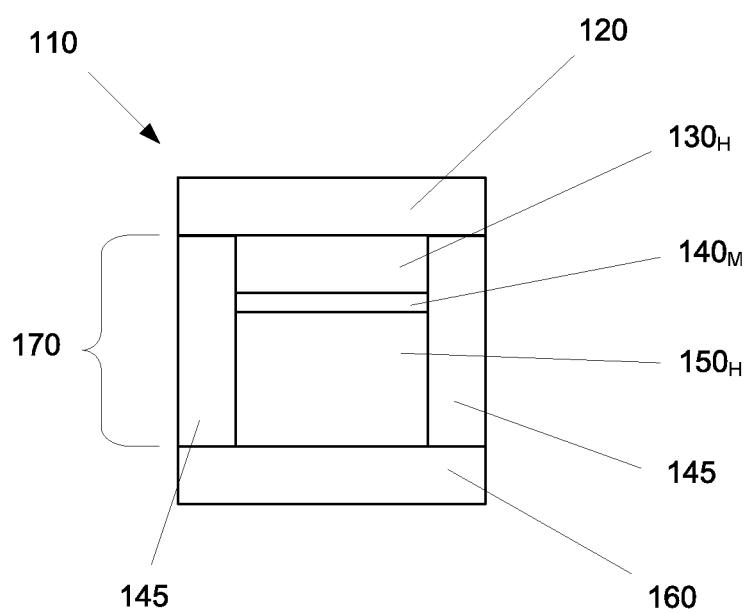
FIG. 4 is a side view schematic of a magnetic tunnel junction having free and fixed Heusler magnetic layers.

In order to improve the performance of the magnetic tunnel junction 170 as shown in FIG. 4, the free magnetic layer and the fixed magnetic layer may formed from Heusler alloys (also called "Heusler half-metals"), which are labeled as free Heusler magnetic layer $130_H$ and fixed Heusler magnetic layer $150_H$. Heusler alloys are ferromagnetic metal alloys based on a Heusler phase, which are intermetallics having a specific composition and face-centered cubic crystal structure. Heusler alloys possess ferromagnetic properties dues to a double-exchange mechanism between neighboring magnetic ions. Such Heusler alloys may include, but are not limited to type XYZ alloys, where X may be cobalt, manganese, iron, and the like, where Y may be vanadium, chromium, titanium, iron, and the like, and wherein Z may be aluminum, gallium, indium, silicon, germanium, tin, phosphorous, antimony, and the like.

These may include common Heusler alloys such as $Co_2FeAl$, $Co_2FeGe$, $Co_2FeSi$, $Co_2MnAl$, $Co_2MnGa$, $Co_2MnGe$, $Co_2MnSi$, $Co_2NiGa$, $Cu_2MnAl$, $Cu_2MnIn$, $Cu_2MnSn$, $Ni_2MnAl$, $Ni_2MnIn$, $Ni_2MnSb$, $Ni_2MnGa$, $Ni_2MnSn$, $Pd_2MnAl$, $Pd_2MnIn$, $Pd_2MnSb$, and $Pd_2MnSn$ (wherein Al is aluminum, Co is cobalt, Cu is copper, Fe is iron, Ga is gallium, Ge is germanium, In is indium, Mn is manganese, Ni is nickel, Pd is palladium, Sb is antimony, Si is silicon, and Sn is tin. As will be understood to those skilled in the art, such Heusler alloys act as their own filter, because, depending on their spin state, they can be highly metallic or much less metallic (assuming "spin-up" to be the conducting state and "spin-down" to be the insulating state). As the Heusler alloy acts as its own spin filter, the insulative MgO tunnel barrier layer 140 of FIG. 3 can be replaced by a metal spacer $140_M$, as shown in FIG. 4. In the conducting phase, the free Heusler magnetic layer $130_H$ and the fixed Heusler magnetic layer $150_H$ are both spin-up, the magnetic tunnel junction 170 is conductive and charge passes through unimpeded. If the free Heusler magnetic layer $130_H$ is switched into the spin-down configuration, then the magnetic tunnel junction 170 is resistive and little or no current passes through. However, as the free Heusler magnetic layer $130_H$, the fixed Heusler magnetic layer $150_H$, and the metal spacer $140_M$ are metals, the resistance state is still very conductive, the resistances required do not match the spin transfer torque memory cell 100 (see FIGS. 1a and 1b) requirements. In other words, the resistance state of the magnetic tunnel junction 170 needs to match or be be greater than the resistance of the transistor 180 (typically about 1 kΩ-10 KΩ). Although it is conceivable to re-insert the MgO tunnel barrier layer 140 of FIG. 3, instead of the metal spacer $140_M$, to increase the resistance and to also act as a second spin filter to further enhance the tunnel magneto-resistance ratio, such as a configuration will not be effective because of lattice mismatch between the Heusler magnetic layers $130_H$ and $150_H$ and the magnesium oxide. As will be understood to those skilled in the art, the Heusler magnetic layers $130_H$ and $150_H$ must have a good crystalline structure to be effective and formation of such layers abutting a lattice mismatch material may not result in poor crystalline structure one or both Heusler magnetic layers $130_H$ and $150_H$.

Figure 5:
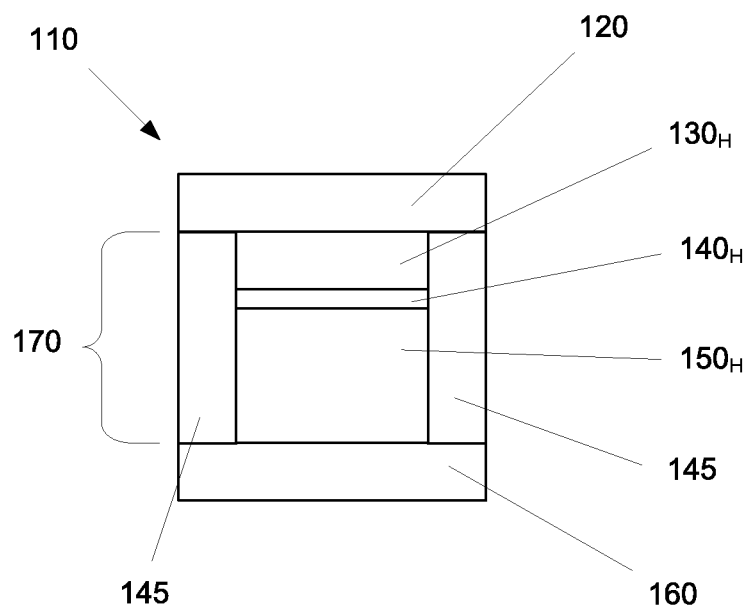
FIG. 5 is a side view schematic of a magnetic tunnel junction having free and fixed Heusler magnetic layers with a lattice matched tunnel barrier layer in accordance with an embodiment of the present description.

FIG. 5 illustrates the magnetic tunnel junction 170 according to one embodiment of the present description. The magnetic tunnel junction 170 may have the free magnetic layer $130_H$ and the fixed magnetic layer $150_H$ may be formed from Heusler alloys, as previously discussed, and the tunnel barrier layer $140_H$ may comprise an insulative layer that is lattice matched to the Heusler alloys of the free Heusler magnetic layer $130_H$. In a specific embodiment, the free Heusler magnetic layer $130_H$ and the fixed Heusler magnetic layer $150_H$ may be comprise MnXGa, MnXSn, MnXSb, CoXGa, CoXAl, and CoXSi, where Mn is manganese, Ga is gallium, Sn is tin, Sb is antimony, Co is cobalt, Al is aluminum, Si is silicon, and where X many comprise manganese, vanadium, chromium, titanium, and iron. In one embodiment, the tunnel barrier layer $140_H$ comprises a strontium titanate film. In such an embodiment, using the strontium titanate film as the tunnel barrier layer $140_H$ may have two advantages. First, strontium titanate is an insulator, and, as such, it will increase the resistance of the magnetic tunnel junction 170. Secondly, strontium titanate is lattice matched to Heusler alloys. This allows for the growth of the free Heusler magnetic layer $130_H$ on the strontium titanate tunnel barrier layer $140_H$ during the fabrication of the magnetic tunnel junction 170. It is understood that the strontium titanate tunnel barrier layer $140_H$ must be sufficiently thin to allow for current flow. In one embodiment of the present description, the strontium titanate tunnel barrier layer $140_H$ may have a thickness T of between about 1 unit cell and 20 unit cells. In a further embodiment, the strontium titanate tunnel barrier layer $140_H$ may have a thickness T, which results in the magnetic tunnel junction 170 having a resistance between about 1 KΩ-10 kΩ and, as such, match the resistance of the transistor 180 allowing it to be read by a sense amplifier, as will be understood to those skilled in the art.

In another embodiment, the free magnetic layer $130_H$ and the fixed magnetic layer $150_H$ may be Co$_2$FeAl (5.66 A) lattice matched the tunnel barrier layer $140_H$ of gallium arsenide (5.69 A).

In a further embodiment, the tunnel barrier layer $140_H$ may comprise a material selected from the Spinel oxide group, including but not limited to NiAl$_2$O$_4$, MgAl$_2$O$_4$, CoAl$_2$O$_4$, CoCo$_2$O$_4$, and FeAl$_2$O$_4$.

As previously discussed, forming a crystalline Heusler alloy is critical; thus, in one embodiment, the fixed magnetic layer electrode 160 may be formed from platinum, which has a fair lattice match to Heusler alloys. The fixed Heusler magnetic layer $150_H$ may then be formed on the platinum fixed magnetic layer electrode 160, which results in the fixed Heusler magnetic layer $150_H$ having an appropriate crystalline structure. The lattice matched tunnel barrier layer $140_H$ may then be formed on the fixed Heusler magnetic layer $150_H$. The free Heusler magnetic layer $130_H$ may be formed on the lattice matched tunnel barrier layer $140_H$, which results in the free Heusler layer $130_H$ having a correct crystalline orientation. The free magnetic layer electrode 120 may then be formed on the free Heusler magnetic layer $130_H$.

In an alternate embodiment, the free Heusler magnetic layer $130_H$ may be formed first. The lattice matched tunnel barrier layer $140_H$ may then be formed on the free Heusler magnetic layer $130_H$. The fixed Heusler magnetic layer $130_H$ may be formed on the lattice matched tunnel barrier layer $140_H$, which results in the free Heusler layer $130_H$ having a correct crystalline orientation.

Although the precise methods of fabricating the magnetic tunnel junction 170 of FIG. 5 has not been described herein, it is understood that the steps for fabrication may include standard microelectronic fabrication processes such as lithography, etch, thin films deposition, planarization (such as chemical mechanical polishing (CMP)), diffusion, metrology, the use of sacrificial layers, the use of etch stop layers, the use of planarization stop layers, and/or any other associated action with microelectronic component fabrication.

Figure 6:
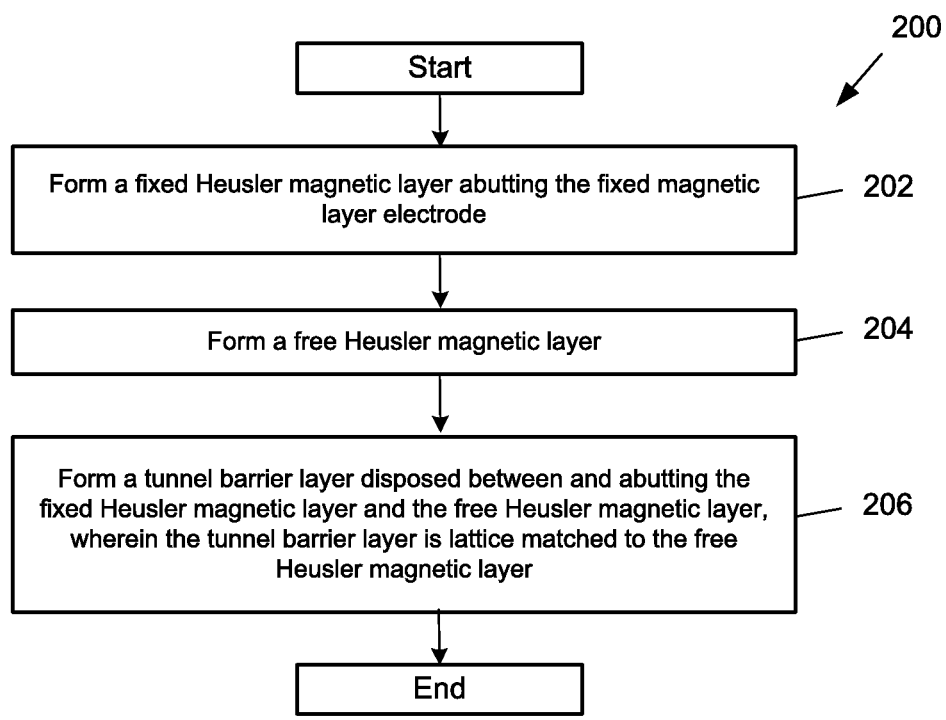
FIG. 6 is a flow diagram of a process of fabricating a magnetic tunnel junction in accordance with an embodiment of the present description.

FIG. 6 is a flow chart of a process 200 of fabricating a magnetic tunnel junction according to an embodiment of the present description. As set forth in block 202, a fixed magnetic layer electrode may be formed. A fixed Heusler magnetic layer may be formed on the fixed magnetic layer electrode, as set forth in block 204. As set forth in block 206, a free Heusler magnetic layer may be formed over the fixed Heusler magnetic layer with an tunnel barrier layer formed between and abutting both the fixed Heusler magnetic layer and the free Heusler magnetic layer, wherein the tunnel barrier layer is lattice matched to the free Heusler magnetic layer. A free magnetic layer electrode may be formed on the free Heusler magnetic layer, as set forth in block 208.

Figure 7:
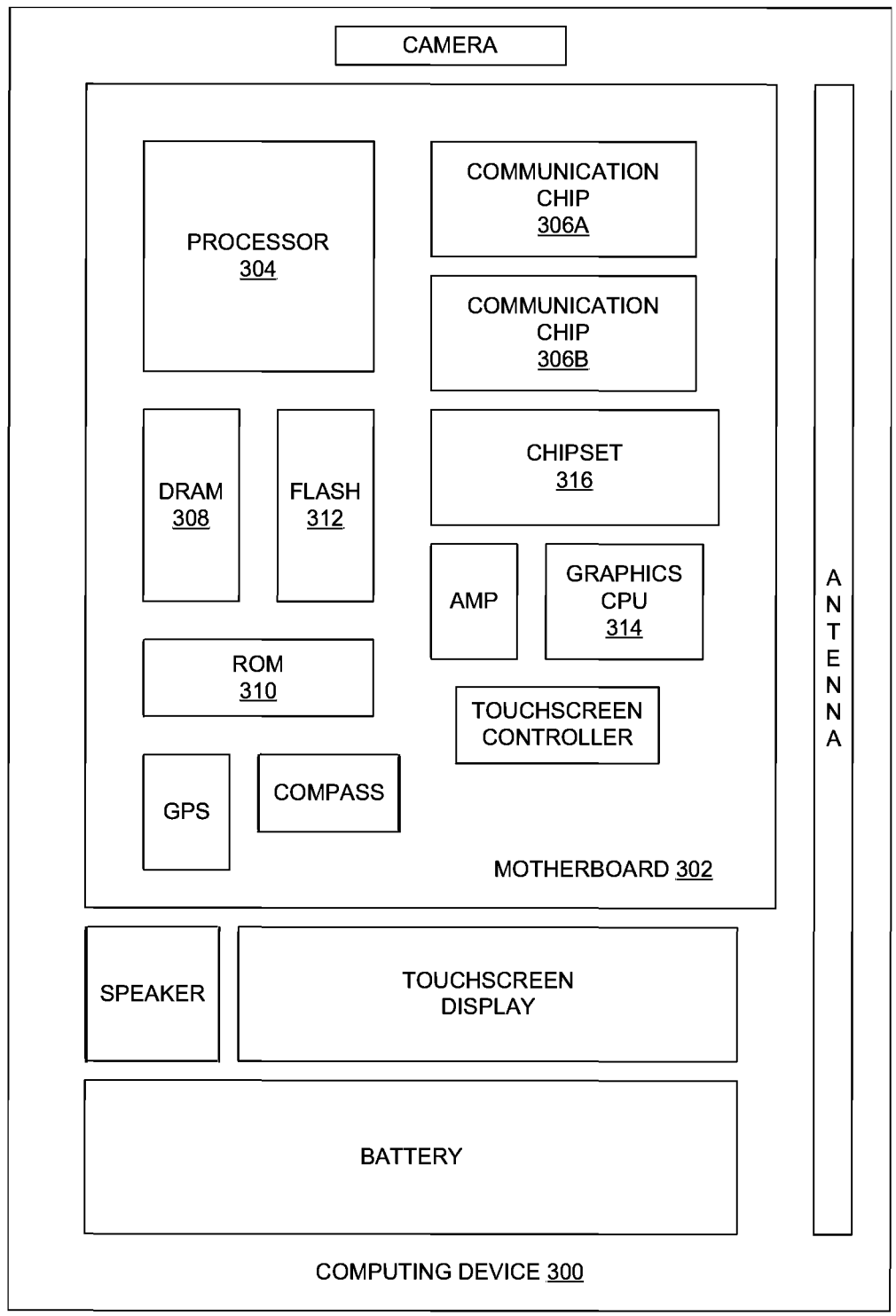
FIG. 7 illustrates a computing device in accordance with one implementation of the present description.

FIG. 7 illustrates a computing device 300 in accordance with one implementation of the present description. The computing device 300 houses a board 302. The board 302 may include a number of components, including but not limited to a processor 304, at least one communication chip 306A, 306B, volatile memory 308, (e.g., DRAM), non-volatile memory 310 (e.g., ROM), flash memory 312, a graphics processor or CPU 314, a digital signal processor (not shown), a crypto processor (not shown), a chipset 316, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker (not shown), a camera, and a mass storage device (not shown) (such as hard disk drive, compact disk (CD), digital versatile disk (DVD), and so forth). Any of the microelectronic components may be physically and electrically coupled to the board 302. In some implementations, at least one of the microelectronic components may be a part of the processor 304.

The communication chip(s) 306A, 306B enable wireless communications for the transfer of data to and from the computing device 300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip(s) 306A, 306B may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 300 may include a plurality of communication chips 306A, 306B. For instance, a first communication chip 306A may be dedicated to shorter range wireless communications such as Wi-Fi and Bluetooth and a second communication chip 306B may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

Any of the microelectronic components within the computing device 300 may include a magnetic tunnel junction, including a fixed magnetic layer electrode, a fixed Heusler magnetic layer abutting the fixed magnetic layer electrode, a free Heusler magnetic layer, and a tunnel barrier layer disposed between and abutting the fixed Heusler magnetic layer and the free Heusler magnetic layer, wherein the tunnel barrier layer is lattice matched to the free Heusler magnetic layer, as described above.

In various implementations, the computing device 300 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 300 may be any other electronic device that processes data.

It is understood that the subject matter of the present description is not necessarily limited to specific applications illustrated in the figures. The subject matter may be applied to other microelectronic device and assembly applications, as well as any appropriate transistor application, as will be understood to those skilled in the art.

The following examples pertain to further embodiments, wherein Example 1 is a microelectronic device, comprising a magnetic tunnel junction, including a fixed Heusler magnetic layer, a free Heusler magnetic layer; and a tunnel barrier layer disposed between and abutting the fixed Heusler magnetic layer and the free Heusler magnetic layer, wherein the tunnel barrier layer is lattice matched to the free Heusler magnetic layer.

In Example 2, the subject matter of Example 1 can optionally include the tunnel barrier layer comprises strontium titanate.

In Example 3, the subject matter of Example 1 can optionally include the tunnel barrier layer comprises a Spinel oxide.

In Example 4, the subject matter of any of Examples 1 to 3 can optionally include a thickness of the tunnel barrier layer being between about 1 unit cell and 10 unit cells.

In Example 5, the subject matter of any of Examples 1 to 3 can optionally include a resistance of the magnetic tunnel junction being between about 1 k$\Omega$-10 k$\Omega$.

In Example 6, the subject matter of Example 1 can optionally include a free magnetic layer electrode abutting the free Heusler magnetic layer and a fixed magnetic layer electrode abutting the fixed Heusler magnetic layer.

In Example 7, the subject matter of Example 6 can optionally include at least one of the free magnetic layer electrode and the fixed magnetic layer electrode comprising platinum.

In Example 8, the subject matter of Example 6 can optionally include the fixed magnetic layer electrode electrically connected to a bit line, and a transistor electrically connected to the free magnetic layer electrode, a source line, and a word line.

In Example 9, the subject matter of Example 6 can optionally include the free magnetic layer electrode electrically connected to a bit line, and a transistor electrically connected to the fixed magnetic layer electrode, a source line, and a word line.

The following examples pertain to further embodiments, wherein Example 10 is a method of forming a microelectronic device, comprising forming a magnetic tunnel junction, including: forming a fixed Heusler magnetic layer abutting the fixed magnetic layer electrode, forming a free Heusler magnetic layer; and forming a tunnel barrier layer disposed between and abutting the fixed Heusler magnetic layer and the free Heusler magnetic layer, wherein the tunnel barrier layer is lattice matched to the free Heusler magnetic layer.

In Example 11, the subject matter of Example 10 can optionally include forming the tunnel barrier layer comprising forming a strontium titanate tunnel barrier layer.

In Example 12, the subject matter of Example 10 can optionally include forming the tunnel barrier layer comprising forming a Spinel oxide tunnel barrier layer.

In Example 13, the subject matter of any of Examples 9 to 10 can optionally include forming the tunnel magnetic junction having a thickness between about 1 unit cell and 10 unit cells.

In Example 14, the subject matter of any of Examples 10 to 12 can optionally include forming the tunnel magnetic junction having a resistance between about 1 k$\Omega$-10 k$\Omega$.

In Example 15, the subject matter of Example 10 can optionally include the fixed Heusler magnetic layer being first formed, followed by forming the tunnel barrier layer on the fixed Heusler magnetic layer, and forming the free Heusler magnetic layer on the tunnel barrier layer.

In Example 16, the subject matter of Example 10 can optionally include forming a platinum fixed magnetic layer electrode, wherein the fixed Heusler magnetic is formed on the platinum fixed magnetic layer electrode.

In Example 17, the subject matter of Example 10 can optionally include the free Heusler magnetic layer being first formed, followed by forming the tunnel barrier layer on the free Heusler magnetic layer, and forming the fixed Heusler magnetic layer on the tunnel barrier layer.

In Example 18, the subject matter of Example 10 can optionally include forming a platinum free magnetic layer electrode, wherein the free Heusler magnetic is formed on the platinum free magnetic layer electrode.

In Example 19, the subject matter of Example 10 can optionally include electrically connecting the fixed magnetic layer electrode to a bit line, and forming a transistor electrically connected to the free magnetic layer electrode, a source line, and a word line.

In Example 20, the subject matter of Example 10 can optionally include electrically connecting the free magnetic layer electrode to a bit line, and forming a transistor electrically connected to the fixed magnetic layer electrode, a source line, and a word line.

The following examples pertain to further embodiments, wherein Example 21 is an electronic system, comprising a board; and a microelectronic device attached to the board, wherein the microelectronic device includes a spin transfer torque memory device having a magnetic tunnel junction, including a fixed Heusler magnetic layer, a free Heusler magnetic layer; and a tunnel barrier layer disposed between and abutting the fixed Heusler magnetic layer and the free Heusler magnetic layer, wherein the tunnel barrier layer is lattice matched to the free Heusler magnetic layer.

In Example 22, the subject matter of Example 21 can optionally include the tunnel barrier layer comprises strontium titanate.

In Example 23, the subject matter of Example 21 can optionally include the tunnel barrier layer comprises a Spinel oxide.

In Example 24, the subject matter of any of Examples 21 to 23 can optionally include a thickness of the tunnel barrier layer being between about 1 unit cell and 10 unit cells.

In Example 25, the subject matter of any of Examples 21 to 23 can optionally include a resistance of the magnetic tunnel junction being between about 1 kΩ-10 kΩ.

In Example 26, the subject matter of Example 21 can optionally include a free magnetic layer electrode abutting the free Heusler magnetic layer and a fixed magnetic layer electrode abutting the fixed Heusler magnetic layer.

In Example 27, the subject matter of Example 26 can optionally include at least one of the free magnetic layer electrode and the fixed magnetic layer electrode comprising platinum.

In Example 28, the subject matter of Example 26 can optionally include the fixed magnetic layer electrode electrically connected to a bit line, and a transistor electrically connected to the free magnetic layer electrode, a source line, and a word line.

In Example 29, the subject matter of Example 26 can optionally include the free magnetic layer electrode electrically connected to a bit line, and a transistor electrically connected to the fixed magnetic layer electrode, a source line, and a word line.

Having thus described in detail embodiments of the present description, it is understood that the present description defined by the appended claims is not to be limited by particular details set forth in the above description, as many apparent variations thereof are possible without departing from the spirit or scope thereof.

What is claimed is:

1. A microelectronic device, comprising:
   a magnetic tunnel junction, including:
      a fixed Heusler magnetic layer;
      a free Heusler magnetic layer; and
      a tunnel barrier layer disposed between and abutting the fixed Heusler magnetic layer and the free Heusler magnetic layer, wherein the tunnel barrier layer has a lattice parameter that is substantially the same as that of the free Heusler magnetic layer.

2. The microelectronic device of claim 1, wherein the tunnel barrier layer comprises strontium titanate.

3. The microelectronic device of claim 1, wherein the tunnel barrier layer comprises a Spinel oxide.

4. The microelectronic device of claim 1, wherein a thickness of the tunnel barrier layer is between about 1 unit cell and 10 unit cells.

5. The microelectronic device of claim 1, wherein a resistance of the magnetic tunnel junction is between about 1 kΩ-10 kΩ.

6. The microelectronic device of claim 1, further comprising a free magnetic layer electrode abutting the free Heusler magnetic layer and a fixed magnetic layer electrode abutting the fixed Heusler magnetic layer.

7. The microelectronic device of claim 6, wherein at least one of the free magnetic layer electrode and the fixed magnetic layer electrode comprises platinum.

8. The microelectronic device of claim 6, further comprising:
   the fixed magnetic layer electrode electrically connected to a bit line; and
   a transistor electrically connected to the free magnetic layer electrode, a source line, and a word line.

9. The microelectronic device of claim 6, further comprising:
   the free magnetic layer electrode electrically connected to a bit line; and
   a transistor electrically connected to the fixed magnetic layer electrode, a source line, and a word line.

10. A method of forming a microelectronic device, comprising:
    forming a magnetic tunnel junction, including:
       forming a fixed Heusler magnetic layer;
       forming a free Heusler magnetic layer; and
       forming a tunnel barrier layer disposed between and abutting the fixed Heusler magnetic layer and the free Heusler magnetic layer, wherein the tunnel barrier layer has a lattice parameter that is substantially the same as that of the free Heusler magnetic layer.

11. The method of claim 10, wherein forming the tunnel barrier layer comprises forming a strontium titanate tunnel barrier layer.

12. The method of claim 10, wherein forming the tunnel barrier layer comprises forming a Spinel oxide tunnel barrier layer.

13. The method of claim 10, wherein forming the tunnel barrier layer comprises forming the tunnel barrier layer having a thickness between about 1 unit cell and 10 unit cells.

14. The method of claim 10, wherein forming the magnetic tunnel junction comprises forming the magnetic tunnel junction having a resistance between about 1 kΩ-10 kΩ.

15. The method of claim 10, wherein the fixed Heusler magnetic layer is first formed, followed by forming the tunnel barrier layer on the fixed Heusler magnetic layer, and forming the free Heusler magnetic layer on the tunnel barrier layer.

16. The method of claim 10, further comprising forming a platinum fixed magnetic layer electrode, wherein the fixed Heusler magnetic is formed on the platinum fixed magnetic layer electrode.

17. The method of claim 10, wherein the free Heusler magnetic layer is first formed, followed by forming the tunnel barrier layer on the free Heusler magnetic layer, and forming the fixed Heusler magnetic layer on the tunnel barrier layer.

18. The method of claim 10, further comprising forming a platinum free magnetic layer electrode, wherein the free Heusler magnetic is formed on the platinum free magnetic layer electrode.

19. The method of claim 10, further comprising:

electrically connecting the fixed Heusler magnetic layer to a bit line; and forming a transistor electrically connected to the free Heusler magnetic layer, a source line, and a word line.

20. The method of claim 10, further comprising:

electrically connecting the free Heusler magnetic layer to a bit line; and forming a transistor electrically connected to the fixed Heusler magnetic layer, a source line, and a word line.

21. An electronic system, comprising:

a board; and a microelectronic device attached to the board, wherein the microelectronic device includes a spin transfer torque memory device having a magnetic tunnel junction, including:

a fixed Heusler magnetic layer;

a free Heusler magnetic layer; and a tunnel barrier layer disposed between and abutting the fixed Heusler magnetic layer and the free Heusler magnetic layer, wherein the tunnel barrier layer has a lattice parameter that is substantially the same as that of the free Heusler magnetic layer.

22. The electronic system of claim 21, wherein the tunnel barrier layer comprises strontium titanate.

23. The electronic system of claim 21, wherein the tunnel barrier layer comprises a Spinel oxide.

24. The electronic system of claim 21, wherein a thickness of the tunnel barrier layer is between about 1 unit cell and 10 unit cells.

25. The electronic system of claim 21, wherein a resistance of the magnetic tunnel junction is between about 1 k$\Omega$-10 k$\Omega$.

* * * * *